United States Patent
Imamura et al.

[11] Patent Number: 6,111,926
[45] Date of Patent: Aug. 29, 2000

[54] BIT SYNCHRONIZING CIRCUIT HAVING HIGH SYNCHRONIZATION CHARACTERISTICS

[75] Inventors: Takeshi Imamura; Satoshi Sato, both of Tokyo, Japan

[73] Assignee: Casio Computer Co., Ltd., Tokyo, Japan

[21] Appl. No.: 08/999,071

[22] Filed: Dec. 29, 1997

[30] Foreign Application Priority Data

Dec. 27, 1996 [JP] Japan .................................. 8-349731

[51] Int. Cl.$^7$ ...................................................... H04L 7/04
[52] U.S. Cl. ......................... 375/360; 375/293; 375/368; 375/371; 375/376
[58] Field of Search .................................. 375/360, 293, 375/371, 376, 368; 340/825.44; 341/100; 455/38.2

[56] References Cited

U.S. PATENT DOCUMENTS

| | | | |
|---|---|---|---|
| 4,868,854 | 9/1989 | Imai et al. ................................. | 375/371 |
| 5,237,590 | 8/1993 | Kazawa et al. ........................... | 375/293 |
| 5,440,298 | 8/1995 | Kuramatsu ............................ | 340/825.44 |
| 5,594,763 | 1/1997 | Nimishakavi ............................ | 375/376 |

Primary Examiner—Stephen Chin
Assistant Examiner—Shuwang Liu
Attorney, Agent, or Firm—Frishauf, Holtz, Goodman, Langer & Chick, P.C.

[57] ABSTRACT

A bit synchronizing circuit is arranged by a bit synchronization counter constructed of an up/down counter or an adding/subtracting counter; an edge detector for detecting an edge of an input NRZ signal to output an edge detection pulse; two sets of edge number counters for counting total numbers of edge detection pulses outputted from the edge detector during a 1 cycle of the counting operation by the bit synchronization counter; and two sets of registers for fetching the count value of the bit synchronization counter at the time instant every time the edge detector outputs the edge detection pulse, and also for storing an accumulation value of the count values fetched during the 1 cycle of the counting operation by the bit synchronization counter. Both the two edge number counters and the two registers are operated with shifts of a half cycle, respectively. This bit synchronization circuit is further arranged by a judging circuit for judging a synchronization shift amount between the input NRZ signal and the counting operation by the bit synchronization counter based on the count values of the two edge number counters and the accumulate values stored in the two registers, and for outputting a correction signal corresponding to the judgment result to the bit synchronization counter.

8 Claims, 11 Drawing Sheets

BIT SYNCHRONIZING CIRCUIT HAVING HIGH SYNCHRONIZATION CHARACTERISTICS

BACKGROUND OF THE INVENTION

1. Field of the Invention

The present invention generally relates to a bit synchronizing circuit used in a communication appliance. More specifically, the present invention is directed to a bit synchronizing circuit having a high synchronization characteristic utilized in, for example, a paging receiver.

2. Description of the Related Art

Various types of paging receivers are commercially available. For instance, in a paging receiver capable of receiving a "POCSAG(Post Office Code Standardization Advisory Group)" type paging signal, i.e., the FSK(Frequency Shift Keying) modulation type paging signal, the received FSK signal is converted into a binary signal of NRZ(Non Return to Zero), and further this NRZ binary signal is converted into digital data by reading as to whether the level of this NRZ binary signal is the high level, or the low level. To correctly convert the FSK signal into the digital data (namely, data demodulation), the above-described level judgment of the binary signal is preferably carried out near center points within the respective bit periods (namely, duration time period of 1-bit data). To realize the correct data demodulation, a bit synchronizing circuit is employed by which the generation timing of the data sampling pulse is synchronized with the bit of the received data. A typical bit synchronizing circuit is shown in FIG. 1.

In this conventional bit synchronizing circuit, reference numeral 1 shows an edge detector for detecting an edge of a waveform (namely, a changing point of a waveform) of an input signal (namely, an NRZ signal obtained from a received FSK signal) is detected, and then for outputting a detection pulse. The detection pulse outputted from this edge detector 1 is entered into an edge number counter 2, and also another edge number counter 3. The edge number counter 2 counts the number of the detection pulse derived from the edge detector 1 only when a count value of an up/down counter 4 (will be explained later) becomes greater than, or equal to a half count value, and also resets the count value thereof when this count value reaches a preselected value and further sends out an up signal to the up/down counter 4. On the other hand, the other edge number counter 3 counts the number of the detection pulse derived from the edge detector 1 only when a count value of an up/down counter 4 becomes smaller than, or equal to a half count value, and also resets the count value thereof when this count value reaches a preselected value and further sends out a down signal to the up/down counter 4.

The up/down counter 4 executes both the up-counting operation and the down-counting operation in addition to the normal counting operation during which the counting operation is performed one by one in response to the clock "CK" having the clock speed N ("N" being an integer, for example, 16) times higher than the bit rate of the input signal. In the up-counting operation, the counting operation is further performed by 1 count when the up signal is supplied from the edge number counter 2. In the down-counting operation, the normal count-up operation is pulled out by 1 count when the down signal is supplied from the edge number counter 3. This up/down counter 4 may constitute the bit synchronization counter. When the clock speed is N times higher than the bit rate of the input signal, this up/down counter 4 is executes such a counting operation that N counts are set as a 1 cycle. As a result, since the up-counting operation and the down-counting operation are carried out in response to the signals outputted from the edge number counters 2 and 3, the phase is corrected, so that such a bit synchronization signal synchronized with the bit of the input signal can be outputted. Then, normally, when the count value of this up/down counter 4 reaches a half value of the full count value (for example 16), the synchronization pulse is outputted to be supplied as the data sampling pulse to the data demodulating circuit.

In the above-described circuit arrangement, in the case that the count value when the edge number counter 2 outputs the up signal is set to the small value and the count value when the edge number counter 3 outputs the down signal is set to the small value, the count value corrections of the up/down counter 4 frequently occur based on the noise contained in the input signal and the bit data having the deteriorated duty ratio (namely, bit data having bit length longer than normal bit length, or bit data having bit length shorter than normal bit length), which would deteriorate the synchronization stability. Conversely, when the count values of the edge number counters 2 and 3 are set to the large values, although the synchronization stability is increased, there is a problem that the synchronization capture speeds are delayed. In other words, there is such a drawback that lengthy time is necessarily required from the asynchronous condition, for instance, from such a condition occurred just after the power supply of the paging receiver is turned ON until the synchronous condition.

Furthermore, since the above-described conventional bit synchronizing circuit is so arranged as to output the up signal and the down signal when both the edge number counter 2 and the edge number counter 3 count each of predetermined values, even when the count values of the edge number counters 2 and 3 are set to the large values, there is a further problem that the count value corrections of the up/down counter 4 based on the noise contained in the input signal cannot be avoided.

SUMMARY OF THE INVENTION

The present invention has been made to solve the above-described problems, and therefore, has an object to provide a bit synchronizing circuit with a high synchronization stability and which is not so easily adversely influenced by noise.

Another object of the present invention is to provide a bit synchronizing circuit capable of having a high synchronization capture speed as well as a high synchronization stability.

To achieve the above-described objects, a bit synchronizing circuit, according to a first aspect of the present invention, is featured by comprising: an N-numbering counter countable in response to a clock N ("N" being an integer) times higher than a bit rate of input data; edge detecting means for detecting an edge of a binary signal corresponding to the entered bit data to thereby output an edge detection pulse; reading means for reading a count value of the N-numbering counter every time the edge detecting means outputs the edge detection pulse; first counting means for counting a total number of the edge detection pulse outputted from the edge detecting means within one cycle defined after the count value of the N-numbering counter becomes a first predetermined value until the count value of the N-numbering counter again becomes this first predetermined value; judging means for judging the count value of the first counting means every time the count value of the N-numbering counter becomes the first predetermined value; and also for judging a bit synchronization shift based on the count value read by the reading means only when the count value of the first counting means becomes a predetermined value, whereby a signal used to correct the count value of the N-numbering counter is outputted based on the judgment result; and correcting means for correcting the count value of the N-numbering counter in response to the correction signal outputted from the judging means.

Also, a bit synchronizing method, according to a second aspect of the present invention, is featured by such a method for synchronizing a counting operation of an N-numbering counter with bit timing of an input signal, the N-numbering counter counting in response to a clock N ("N" being an integer) times higher than a bit rate of an input signal, comprising: a first step for detecting a changing point of the input signal; a second step for reading a count value of the N-numbering counter when the changing point of the input signal is detected at the first step; a third step for incrementing a count value of a changing-point-number counter capable of counting a total number of the changing points of the input signal when the changing point of the input signal is detected at the first step; a fourth step for reading the count value of the changing-point-number counter and also for cleaning the count value of the changing-point-number counter every time the count value of the N-numbering counter reaches a predetermined value; a fifth step for judging a bit shift occurred between the input signal and the counting operation of the N-numbering counter based on the count value of the N-numbering counter read at the first step when the count value of the changing-point-number counter read at the fourth step is the predetermined value; and a sixth step for outputting a correction signal based upon the judgment result of the fifth step to thereby correct the count value of the N-numbering counter.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENTS

Referring now to drawings, a description will be made of a first embodiment mode in which the inventive idea of the present invention is applied to a bit synchronizing circuit of a paging receiver.

CONCEPTIONAL CIRCUIT ARRANGEMENT OF PAGING RECEIVER

Figure 2:
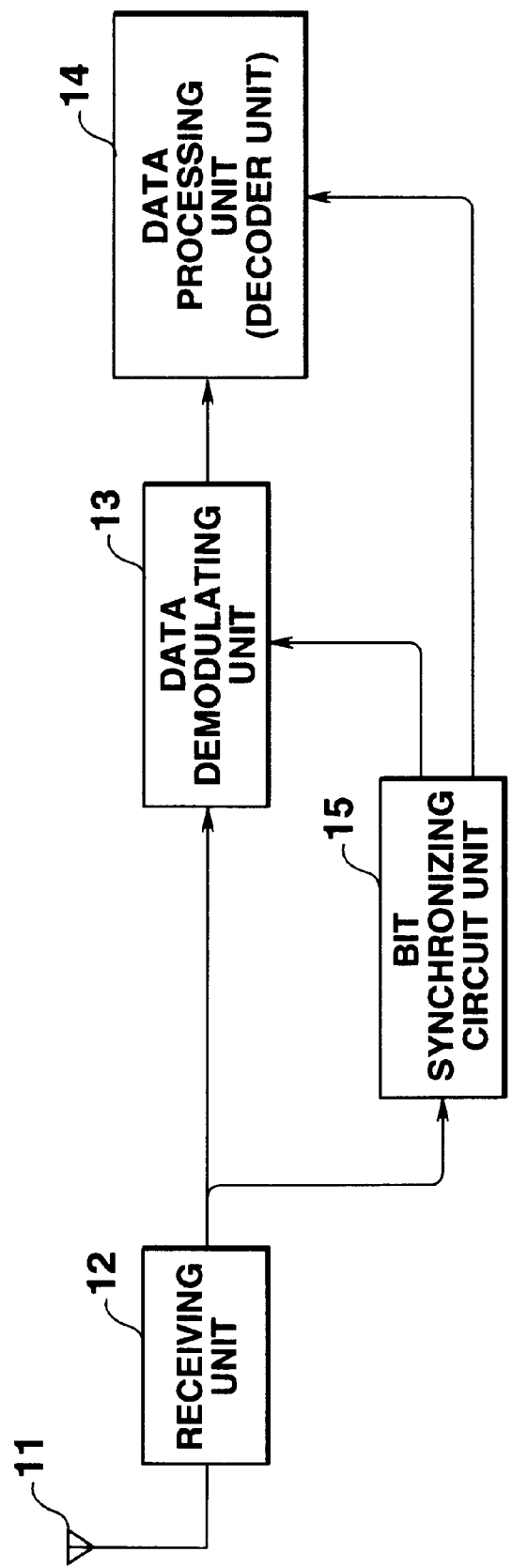
FIG. 2 is a block diagram for showing a basic circuit arrangement of a paging receiver.

FIG. 2 is a schematic block diagram for showing a conceptional circuit arrangement of a paging receiver. In this drawing, reference numeral 11 shows an antenna used to receive a radio (wireless) signal which is modulated in the FSK modulating system, reference numeral 12 shows a receiving unit for converting the radio signal received by the antenna 11 into an NRZ binary signal, and reference numeral 13 represents a data demodulating unit for sampling the NRZ binary signal outputted from the receiving unit to demodulate the sampled binary signal, thereby producing digital data. Also, reference numeral 14 indicates a data processing unit for processing the digital data demodulated by the data demodulating unit 13, and reference numeral 15 shows a bit synchronizing circuit unit.

CIRCUIT ARRANGEMENT OF FIRST BIT SYNCHRONIZING CIRCUIT

Figure 3:
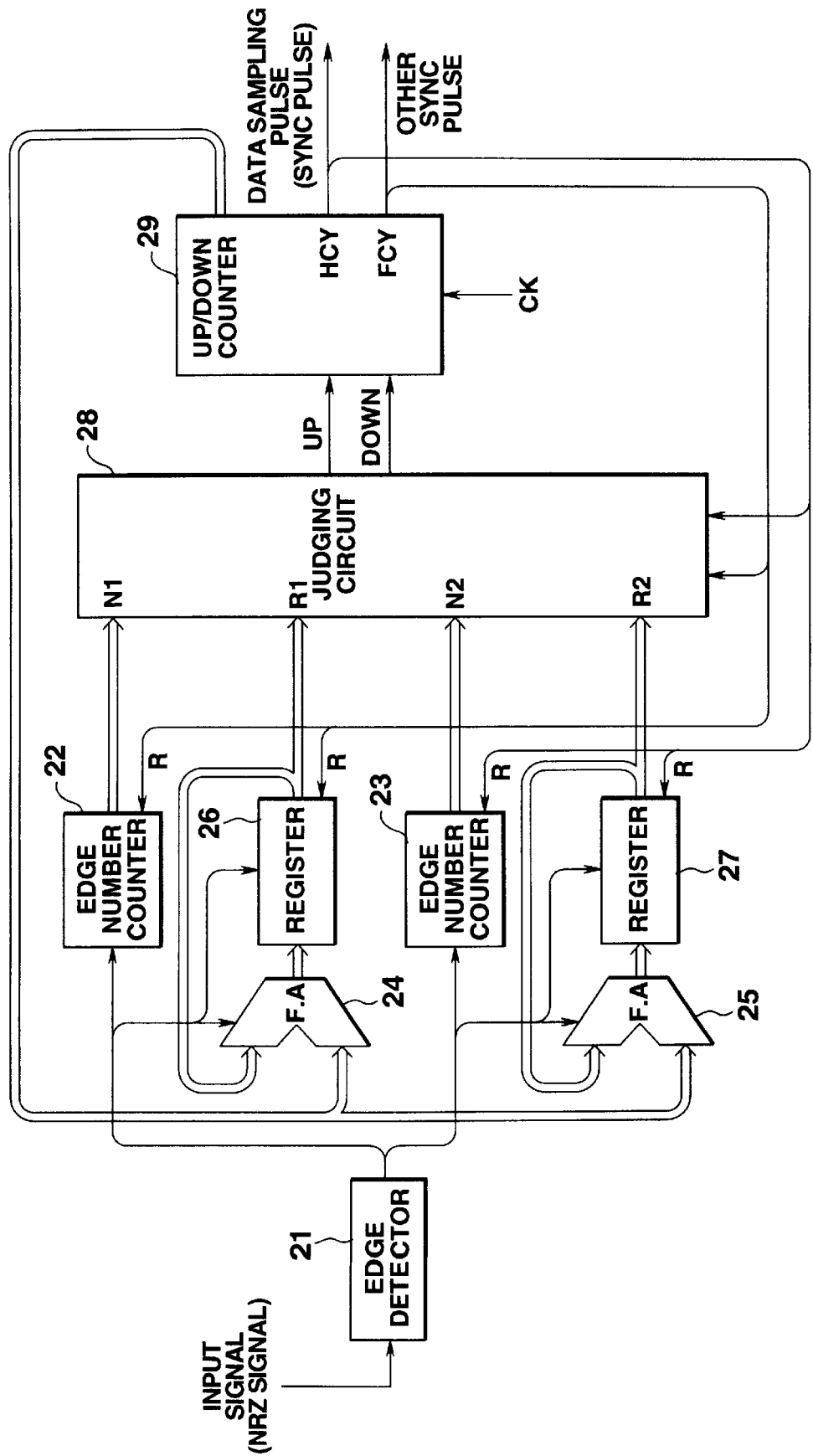
FIG. 3 schematically represents a circuit arrangement of a bit synchronizing circuit according to a first embodiment mode of the present invention.

FIG. 3 schematically represents a detailed circuit arrangement of a bit synchronizing circuit according to a first embodiment mode of the present invention, which is employed in the above-described bit synchronizing circuit unit of FIG. 2. It should be understood that in this first embodiment, a bit synchronization counter is arranged by an up/down counter similar to the conventional bit synchronizing circuit shown in FIG. 1.

In FIG. 3, reference numeral 21 shows an edge detector for detecting an edge of a waveform of an input signal, namely the NRZ signal outputted from the receiving unit 12 shown in FIG. 2, to thereby output an edge detection pulse. The edge detection pulse outputted from the edge detector 21 is supplied to edge number counters 22, 23; full adders 24, 25; and registers 26, 27, respectively.

The edge number counter 22 is a counter resettable by a full carry signal FCY supplied from an up/down counter 29 (will be explained later). This edge number counter 22 may count a total number of edges contained in the input signal, namely a total quantity of the edge detection pulses supplied from the edge detector 21 during such a time period defined after the present resetting operation thereof until the succeeding resetting operation thereof by the full carry signal FCY. This edge number counter 22 supplies the resulting count value to a judging circuit 28.

The edge number counter 23 is a counter resettable by a half carry signal HCY supplied from the up/down counter 29. This edge number counter 23 may count a total number of edges contained in the input signal, namely a total quantity of the edge detection pulses supplied from the edge detector 21 during such a time period defined after the present resetting operation thereof until the succeeding resetting operation thereof by the half carry signal HCY. This edge number counter 23 supplies the resulting count value to the judging circuit 28. In other words, both the edge number counter 22 and the edge number counter 23 count the total edge numbers of the input signal during the respective time periods shifted by ½.

The full adder 24 is initiated every time the edge detection pulse is entered from the edge detector 21, and adds the count value of the up/down counter 29 to the value held in the register 26 at this time to thereby output addition result data to the register 26. This register 26 fetches the addition result data to be stored and held every time the edge detection pulse is entered from the edge detector 21. In other words, both the full adder 24 and the register 26 constitute an accumulator. It should also be noted that the register 26 is so arranged as to be reset in response to the full carry signal FCY derived from the up/down counter 29.

The full adder 25 is initiated every time the edge detection pulse is entered from the edge detector 21, and adds the count value of the up/down counter 29 to the value held in the register 27 at this time to thereby output addition result data to the register 27. This register 27 fetches the addition result data to be stored and held every time the edge detection pulse is entered from the edge detector 21. In other words, both the full adder 25 and the register 27 constitute another accumulator. It should also be noted that the register 27 is so arranged as to be reset in response to the half carry signal HCY derived from the up/down counter 29. The accumulation period of the register 27 is shifted from the accumulation period of the register 26 by ½ time period.

The judging circuit 28 reads both the count value of the edge number counter 22 and the accumulation value stored in the register 26, and then judges the synchronization shift between the input signal and the up/down counter 29 based on these read values every time the full carry signal FCY signal is inputted from the up/down counter 29. Then, this judging circuit 28 sends either an up signal or a down signal to the up/down counter 29 in response to the judgment result. Also, the judging circuit 28 reads both the count value of the edge number counter 23 and the accumulation value stored in the register 27, and then judges the synchronization shift between the input signal and the up/down counter 29 based on these read values every time the half carry signal HCY signal is inputted from the up/down counter 29. Then, this judging circuit 28 sends either an up signal or a down signal to the up/down counter 29 in response to the judgment result.

Figure 1:
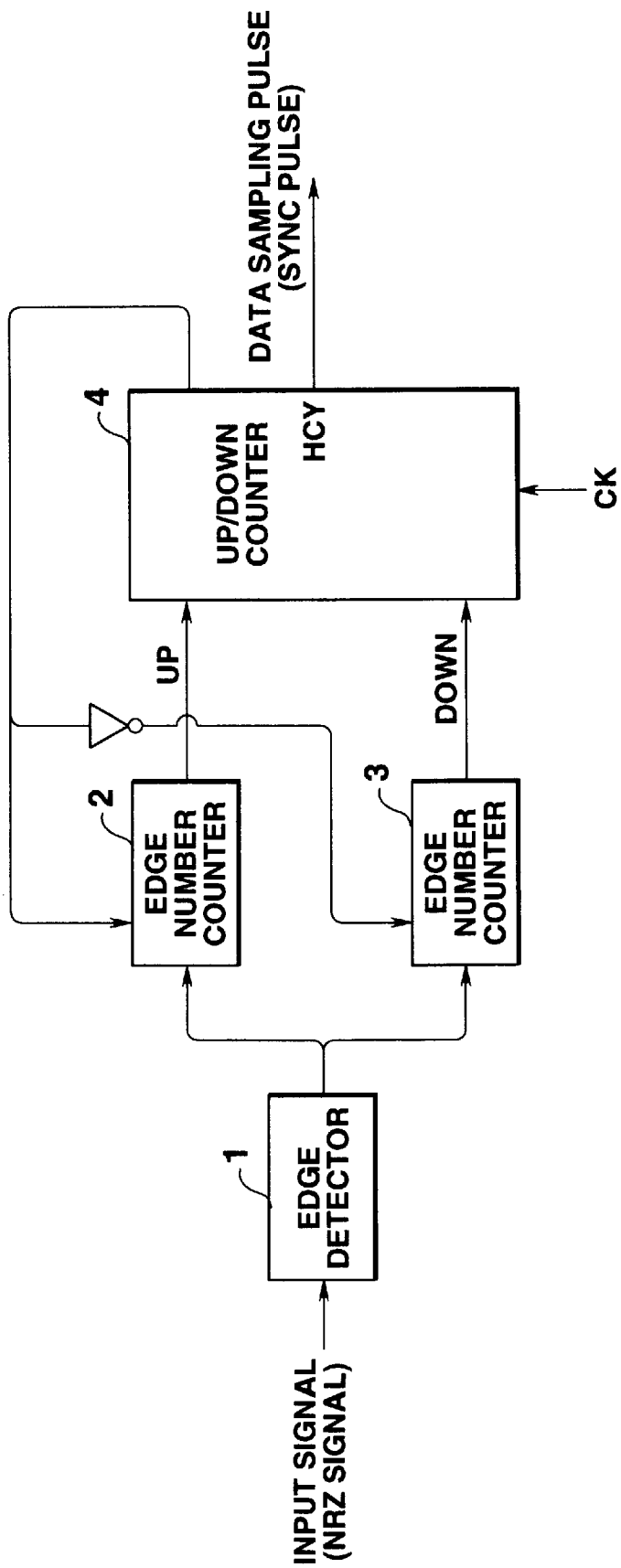
FIG. 1 is a block diagram for representing the circuit arrangement of the conventional bit synchronizing circuit.

The up/down counter 29 is such a counter similar to the conventional up/down counter 4 shown in FIG. 1.

The up/down counter 29 executes both the up-counting operation and the down-counting operation in addition to the normal counting operation during which the counting operation is performed one by one in response to the clock "CK" having the clock speed N ("N" being an integer, for example, 16) times higher than the bit rate of the input signal. In the up-counting operation, the counting operation is further performed by 1 count when the up signal is supplied from the judging circuit 28. In the down-counting operation, the normal count-up operation is pulled out by 1 count when the down signal is supplied from the judging circuit 28. This up/down counter 29 may constitute a bit synchronization counter. When the clock speed is N times higher than the bit rate of the input signal, this up/down counter 29 executes such a counting operation that N counts are set as a 1 cycle.

The count value is supplied to the full adders 24 and 25, as previously explained. Also, when the count value reaches a half of the full count value N (for example 16), the up/down counter 29 outputs a half carry signal (HCY), and then supplies this half carry signal HCY as a data sampling pulse (sync pulse signal) to the data demodulating circuit 13. Also, this half carry signal (HCY) is supplied as a reset signal to both the edge number counter 23 and the register 27, and supplied as a judgment timing signal to the judging circuit 28. Also, when the count value reaches the full count value N (for example 16), the up/down counter 29 outputs a full carry signal (FCY), and then supplies this full carry signal FCY as a sync signal to the data processing circuit 14. Also, this full carry signal (FCY) is supplied as a reset signal to both the edge number counter 22 and the register 26, and supplied as a judgment timing signal to the judging circuit 28.

In the above-described bit synchronizing circuit of this first embodiment mode, the judging circuit 28 executes the below-mentioned process operations every time the half carry signal HCY and the full carry signal FCY derived from the up/down counter 29.

When the full carry signal FCY is inputted, the judging circuit 28 judges a count value N1 of the edge number counter 22 and a value R1 held in the register 26. In the case that the count value N1 of the edge number counter 22 becomes "2" and further the value R1 held in the register 26 is smaller than the full scale value N of the up/down counter 29, this judging circuit 28 outputs the down signal to the up/down counter 29 and executes such a correction that the count value of the up/down counter 29 is subtracted by a preselected value (for example, 1). On the other hand, in the case that the count value N1 of the edge number counter 22 becomes "2" and further the value R1 held in the register 26 is larger than the full scale value N of the up/down counter 29, this judging circuit 28 outputs the up signal to the up/down counter 29 and executes such a correction that the count value of the up/down counter 29 is added by a preselected value (for example, 1). When the count value N1 outputted from the edge number counter 22 is smaller than, or equal to "1", otherwise larger than, or equal to "3", the judging circuit 28 neither outputs the up signal to the up/down counter 29, nor outputs the down signal to this up/down counter 29, and further does not correct the count value.

When the half carry signal HCY is inputted, the judging circuit 28 judges a count value N2 of the edge number counter 23 and a value R2 held in the register 27. In the case that the count value N2 of the edge number counter 23 becomes "2" and further the value R2 held in the register 27 is smaller than the half scale value N/2 of the up/down counter 29 (namely, when count of up/down counter 29 lead to input signal), this judging circuit 28 outputs the down signal to the up/down counter 29. On the other hand, when the count value N2 of the edge number counter 23 becomes "1" and also the value R2 held in the register 27 is larger than, or equal to the half scale value N/2 (namely, when count of up/down counter 29 is delayed from input signal), this judging circuit 28 outputs the up signal to the up/down counter 29. In the case that the count value N2 of the edge number counter 23 becomes "2" and further the value R2 held in the register 27 is smaller than the full scale value N of the up/down counter 29, this judging circuit 28 outputs the up signal to the up/down counter 29. On the other hand, in the case that the count value N2 of the edge number counter 23 becomes "2" and further the value R2 held in the register 27 is larger than, or equal to the full scale value N of the up/down counter 29, this judging circuit 28 outputs the down signal to the up/down counter 29. When the count value N2 outputted from the edge number counter 23 is or equal to "0", otherwise larger than, or equal to "3", the judging circuit 28 neither outputs the up signal to the up/down counter 29, nor outputs the down signal to this up/down counter 29, and further does not correct the count value.

That is, when the pulse width of the input signal (NRZ signal) is the normal width, namely when the count value of the edge number counter 22, or 23 is smaller than, or equal to "1", this judging circuit 28 executes the count value correction only if the half carry signal (HCY) is inputted. When the pulse width of the input signal (NRZ signal) is distorted, namely when the count value of the edge number counter 22 or 23 becomes "2", the judging circuit 28 executes the count value correction if the half carry signal (HCY) is inputted and the full carry signal (FCY) is entered. In such a case that the input signal (NRZ signal) contains the noise, namely when the count value of the edge number counter 22 or 23 becomes larger than, or equal to 3, the judging circuit 28 executes no count value correction if any one of the half carry signal HCY and the full carry signal FCY is entered.

With execution of these process operations, the bit synchronization between the up/down counter 29 (bit synchronization counter) and the input (NRZ) signal can be highly stabilized, and further the bit synchronization capture speed can be increased.

CIRCUIT ARRANGEMENT OF SECOND BIT SYNCHRONIZING CIRCUIT

Figure 4:
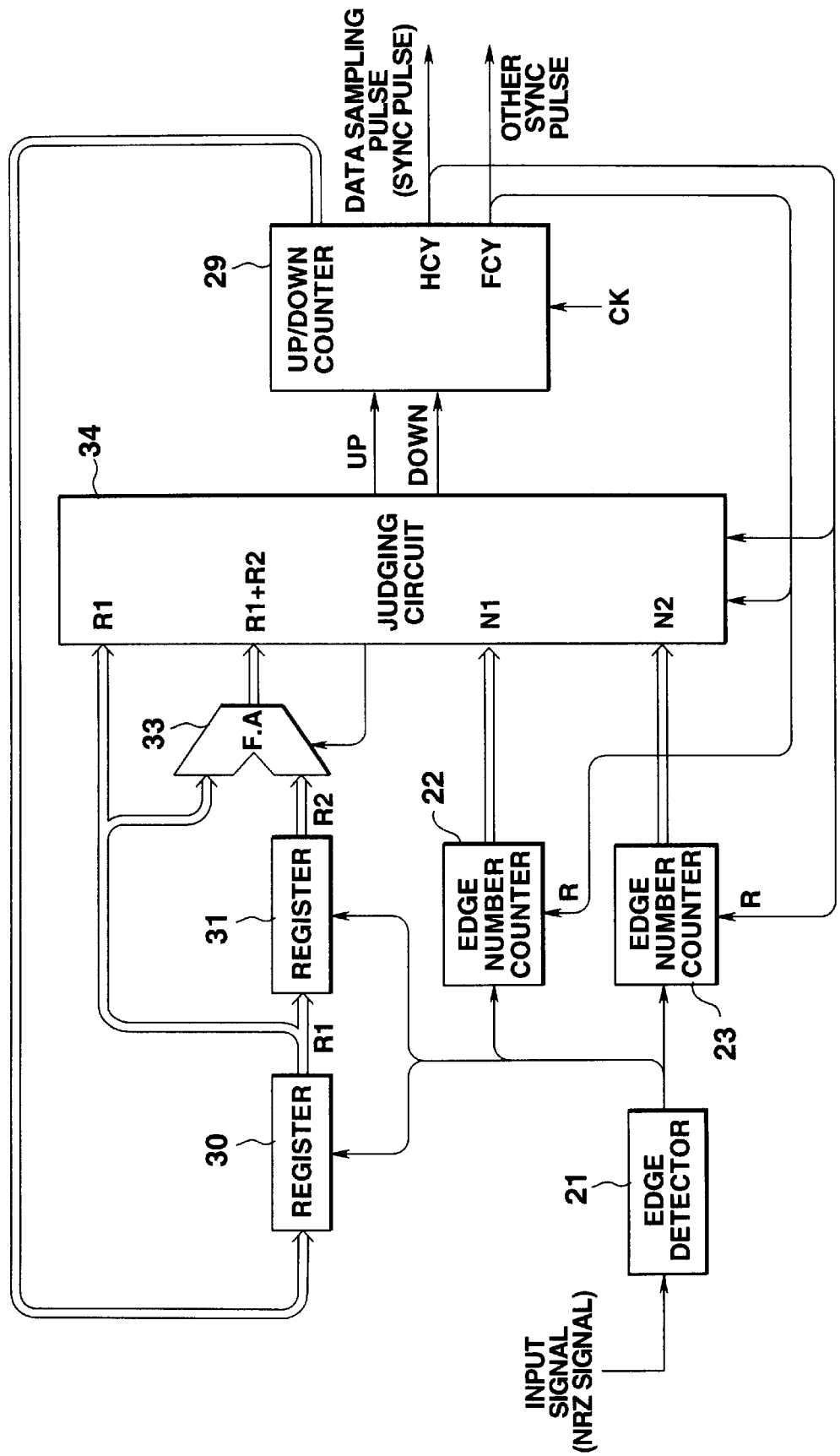
FIG. 4 schematically represents a circuit arrangement of a bit synchronizing circuit according to a second embodiment mode of the present invention.

Referring now to FIG. 4, a bit synchronizing circuit according to a second embodiment of the present invention will be described.

The bit synchronizing circuit of this second embodiment is featured by employing only one full adder 33 to achieve the same function, i.e., the bit synchronization as the first bit synchronizing circuit which employs two sets of the full adders 24 and 25 (see FIG. 3). FIG. 4 shows a circuit arrangement of the second bit synchronizing circuit. It should be noted that the same reference numerals shown in FIG. 3 will be employed as those for denoting the same, or similar circuit elements, and therefore, detailed descriptions thereof are omitted.

In FIG. 4, an edge detector 21 detects a changing point of an NRZ signal obtained from a received input signal, namely an FSK signal to produce an edge detection pulse corresponding to an edge position of a detected signal waveform. That is, the edge detector 21 detects an edge of the NRZ signal to produce such an edge detection pulse which will then be supplied to edge number counters 22, 23 and registers 30, 31.

The edge number counter 22 may count a total number of edges contained in the input signal, namely a total quantity of the edge detection pulses supplied from the edge detector 21 during such a time period defined after the present resetting operation thereof until the succeeding resetting operation thereof by the full carry signal FCY. This edge number counter 22 supplies the resulting count value N1 to a judging circuit 34.

The edge number counter 23 may count a total number of edges contained in the input signal, namely a total quantity of the edge detection pulses supplied from the edge detector 21 during such a time period defined after the present resetting operation thereof until the succeeding resetting operation thereof by the half carry signal HCY. This edge number counter 23 supplies the resulting count value N2 to the judging circuit 34.

The registers 30 and 31 are such latch circuits commonly constituted by employing a plurality of D-type flip-flops (Delayed Flip-Flops). The register 30 holds a count value of the up/down counter 29 at this time in response to the pulse input derived from the edge detector 21, and supplies the saved value R1 to the register 31, the judging circuit 34, and the full adder 33.

Also, the register 31 saves the saved value R1 of the above-described register 30 in response to the pulse input derived from the edge detector 21, and supplies this saved value as an R2 to the full adder 33.

The full adder 33 adds the saved value R1 of the register 30 to the saved value R2 of the register 31 to obtain an addition output "R1+R2" which will then be supplied to the judging circuit 34.

Every time the half carry signal HCY supplied from the up/down counter 29 and the full carry signal FCY therefrom, the judging circuit 34 judges a synchronization shift amount between an input bit (input signal) and the up/down counter 29, depending upon the saved value R1 of the register 30, the addition output "R1+R2" of the full adder 33, and also the count values N1, N2 of the edge number counters 22, 23. Then, this judging circuit 34 sends out either an up signal or a down signal in response to the judgment result to the up/down counter 29.

The up/down counter 29 may execute the normal counting operation in such a manner that this up/down counter 29 is counted up one by one in response to a clock pulse N ("N" being an integer, for example, 16) times higher than the bit rate of the input signal, and further may perform the up-counting operation/the down-counting operation similar to these counting operations in response to the up/down signals supplied from the judging circuit 34, as previously explained in the first embodiment mode (see FIG. 3). As previously explained, the count value of the up/down counter 29 is sent to the register 30. The half carry signal (HCY) of the up/down counter 29 is supplied as the data sampling to the data demodulating circuit 13 of FIG. 2, and also supplied as a reset signal to the edge number counter 23, and further supplied as a judgment timing signal to the judging circuit 34. Also, the full carry signal (FCY) of the up/down counter 29 is supplied as a reference timing signal to the data processing unit 14 of FIG. 2, and supplied as a reset signal to the edge number counter 22, and further supplied as another judgment timing signal to the judging circuit 34, respectively.

In the above-described bit synchronizing circuit of this second embodiment mode, the judging circuit 34 executes the below-mentioned process operations every time the half carry signal HCY and the full carry signal FCY derived from the up/down counter 29.

When the full carry signal FCY is inputted, the judging circuit 34 judges the count value N1 of the edge number counter 22 and the addition of "R1+R2" from the full adder 33. In the case that the count value N1 of the edge number counter 22 becomes "2" and further the addition value of "R1+R2" from the full adder 33 is smaller than the full scale value N of the up/down counter 29, this judging circuit 34 outputs the down signal to the up/down counter 29 and executes such a correction that the count value of the up/down counter 29 is subtracted by a preselected value (for example, 1). On the other hand, in the case that the count value N1 of the edge number counter 22 becomes "2" and further the addition value of "R1+R2" from the full adder 33 is larger than the full scale value N of the up/down counter 29, this judging circuit 34 outputs the up signal to the up/down counter 29 and executes such a correction that the count value of the up/down counter 29 is added by a preselected value (for example, 1). When the count value N1 outputted from the edge number counter 22 is smaller than, or equal to "1", otherwise larger than, or equal to "3", the judging circuit 34 neither outputs the up signal to the up/down counter 29, nor outputs the down signal to this up/down counter 29, and further does not correct the count value.

When the half carry signal HCY is inputted, the judging circuit 34 judges the count value N2 of the edge number counter 23 and the value R1 held in the register 30, and the addition out "R1+R2" of the full adder 33. In the case that the count value N2 of the edge number counter 23 becomes "1" and further the value R1 held in the register 30 is smaller than the half scale value N/2 of the up/down counter 29 (namely, when count of up/down counter 29 lead to input signal), this judging circuit 34 outputs the down signal to the up/down counter 29. On the other hand, when the count value N2 of the edge number counter 23 becomes "1" and also the value R1 held in the register 30 is larger than, or equal to the half scale value N/2 (namely, when count of up/down counter 29 is delayed from input signal), this judging circuit 34 outputs the up signal to the up/down counter 29. In the case that the count value N2 of the edge number counter 23 becomes "2" and further the addition output "R1+R2" of the full adder 33 is smaller than the full scale value N of the up/down counter 29, this judging circuit 34 outputs the up signal to the up/down counter 29. On the other hand, in the case that the count value N2 of the edge number counter 23 becomes "2" and further the addition output "R1+R2" of the full adder 33 is larger than, or equal to the full scale value N of the up/down counter 29, this judging circuit 34 outputs the down signal to the up/down counter 29. When the count value N2 outputted from the edge number counter 23 is or equal to "0", otherwise larger than, or equal to "3", the judging circuit 34 neither outputs the up signal to the up/down counter 29, nor outputs the down signal to this up/down counter 29, and further does not correct the count value.

With execution of these process operations, the bit synchronization between the up/down counter 29 (bit synchronization counter) and the input (NRZ) signal can be highly stabilized, and further the bit synchronization capture speed can be increased similar to those of the first embodiment.

Also, in accordance with this second embodiment, since only one full adder is employed instead of two sets of the full adders in the first embodiment, the overall circuit scale can be reduced.

CIRCUIT ARRANGEMENT OF THIRD BIT SYNCHRONIZING CIRCUIT

Figure 5:
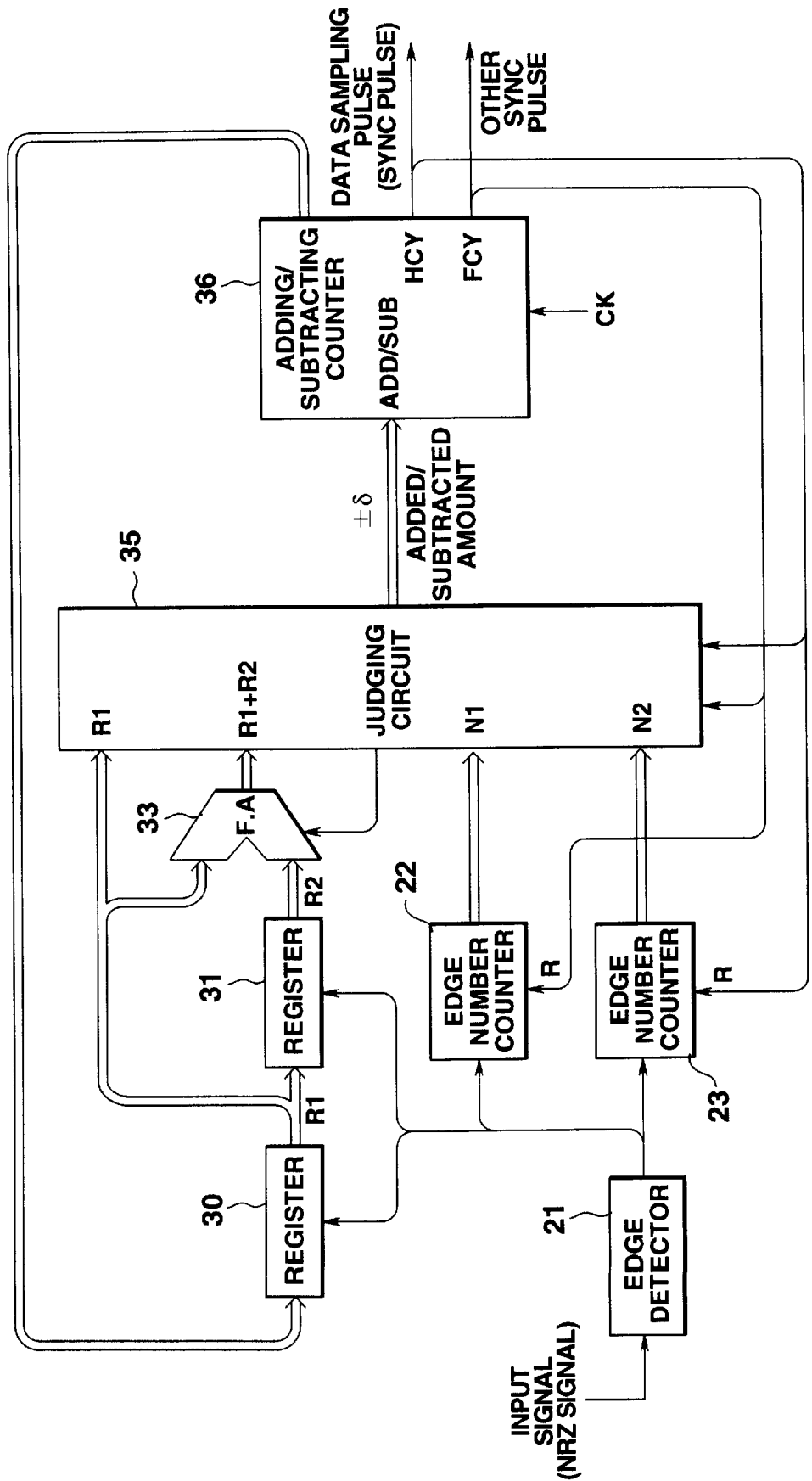
FIG. 5 schematically represents a circuit arrangement of a bit synchronizing circuit according to a third embodiment mode of the present invention.

FIG. 5 schematically represents a circuit arrangement of a bit synchronizing circuit according to a third embodiment mode of the present invention. It should be understood that in this third embodiment, a basic circuit arrangement is similar to the second bit synchronizing circuit shown in FIG. 4, but the following different circuit is made. That is, the bit synchronization counter constituted by the up/down counter in the second embodiment is arranged by an adding/subtracting counter, so that a correction value of a count value which is corrected every 1 cycle may be set to such a value corresponding to a synchronization shift amount. FIG. 5 represents a circuit arrangement of the above-described featured structure. It should be noted that the same reference numerals shown in FIG. 4 will be employed as those for indicating the same, or similar circuit elements of the third embodiment.

In FIG. 5, an edge detector 21, edge number counters 22, 23, registers 30, 31, and a full adder 33 are identical to those of the second embodiment mode shown in FIG. 4.

A judging circuit 35 may judge a synchronization shift amount between an input bit (input signal) and an adder/subtracting counter 36 every time a half carry signal HCY and a full carry signal FCY, derived from the adding/subtracting counter 36 (will be explained later), depending upon contents of the saved value R1 of the register 30, the addition output "R1+R2" of the full adder 33, and the count values N1, N2 of the edge number counters 22, 23. Then, the judging circuit 35 may send out an adding/subtracting amount signal "δ" in accordance with the judgment result to the adding/subtracting counter 36.

The adding/subtracting counter 36 may add, or subtract count values in accordance with the adding/subtracting signal "δ" derived from the judging circuit 35 in addition to the normal counting operation during which the counting operation is performed one by one in response to the clock "CK" having the clock speed N ("N" being an integer, for example, 16) times higher than the bit rate of the input signal. This adding/subtracting counter 36 may constitute a bit synchronization counter. When the clock speed is N times higher than the bit rate of the input signal, this adding/subtracting counter 36 executes such a counting operation that N counts are set as a 1 cycle. The count value is supplied to the register 30, as previously explained. Also, when the count value of the adding/subtracting counter 36 reaches a half of the full count value N (for example 16), this adding/subtracting counter 30 outputs a half carry signal (HCY), and then supplies this half carry signal HCY as a data sampling pulse (sync pulse signal) to the data demodulating circuit 13 of FIG. 2. Also, this half carry signal (HCY) supplied as a judgment timing signal to the judging circuit 35. Also, when the count value of the adding/subtracting counter 36 reaches the full count value N (for example 16), the adding/subtracting counter 36 outputs a full carry signal (FCY), and then supplies this full carry signal FCY as a reference timing signal to the data processing circuit 14 of FIG. 2. Also, this full carry signal (FCY) is supplied as a reset signal to the edge number counter 22 and supplied as a judgment timing signal to the judging circuit 35, respectively.

In the above-described bit synchronizing circuit of this third embodiment mode, the judging circuit 35 executes the below-mentioned process operations every time the half carry signal HCY and the full carry signal derived from the adding/subtracting counter 36.

When the full carry signal FCY is inputted, the judging circuit 35 judges the count value N1 of the edge number counter 22 and the value of the addition output "R1+R2" of the full adder 33. In the case that the count value N1 of the edge number counter 22 becomes "2", this judging circuit 35 executes such a calculation of "R1+R2−N" with employment of the additional result "R1+R2" of the full adder 33, and also the full scale value N of the adding/subtracting counter 36. Then, the judging circuit 35 supplies the calculation result as the adding/subtracting amount signal "δ" to the adding/subtracting counter 36.

When the half carry signal HCY is inputted, the judging circuit 28 judges the count value N2 of the edge number counter 23 and the value R1 held in the register 30, and the addition output "R1+R2" of the full adder 33. In the case that the count value N2 of the edge number counter 23 becomes "1", this judging circuit 35 executes such a calculation of "R1−N/2" by using the saved value R1 of the register 30 and the half scale value N/2 of the adding/subtracting counter 36. When the count value N2 derive from the edge number counter 23 becomes "2", this judging circuit 35 executes such a calculation of "−1×(R1+R2−N)". Then, the judging circuit 35 supplies the respective calculation results as the adding/subtracting amount signal "δ" to the adding/subtracting counter 36.

It should be understood that in the case other than the above-described cases, the judging circuit 35 does not output the adding/subtracting signal "δ". In other words, when the full carry signal FCY is inputted, if the count value N1 derived from the edge number counter 22 is smaller than, or equal to "1", otherwise larger than, or equal to "3", then no adding/subtracting signal "δ" is outputted. Also, when the half carry signal HCY is inputted, if the count value N2 derived from the edge number counter 23 is equal to "0", otherwise larger than, or equal to "3", then no adding/subtracting signal "δ" is outputted.

In the adding/subtracting counter 36, the following correcting operation is carried out every time the adding/subtracting amount signal "δ" is supplied from the judging circuit 35. That is, the count value of the adding/subtracting counter 36 is incremented/decremented only by the supplied adding/subtracting amount signal "δ".

As previously described in detail, the bit synchronizing circuit according to this third embodiment mode is arranged in such a manner that the bit synchronizing counter is arranged by the adding/subtracting counter 36, and the count value of this adding/subtracting counter 36 is incremented/decremented based on the adding/subtracting amount signal "δ" outputted from the judging circuit 35. As a consequence, it is possible to achieve a similar effect to that of the second embodiment. At the same time, the bit synchronization capture speed can be advantageously made higher than that of the second embodiment.

CIRCUIT ARRANGEMENT OF FOURTH BIT SYNCHRONIZING CIRCUIT

Figure 6:
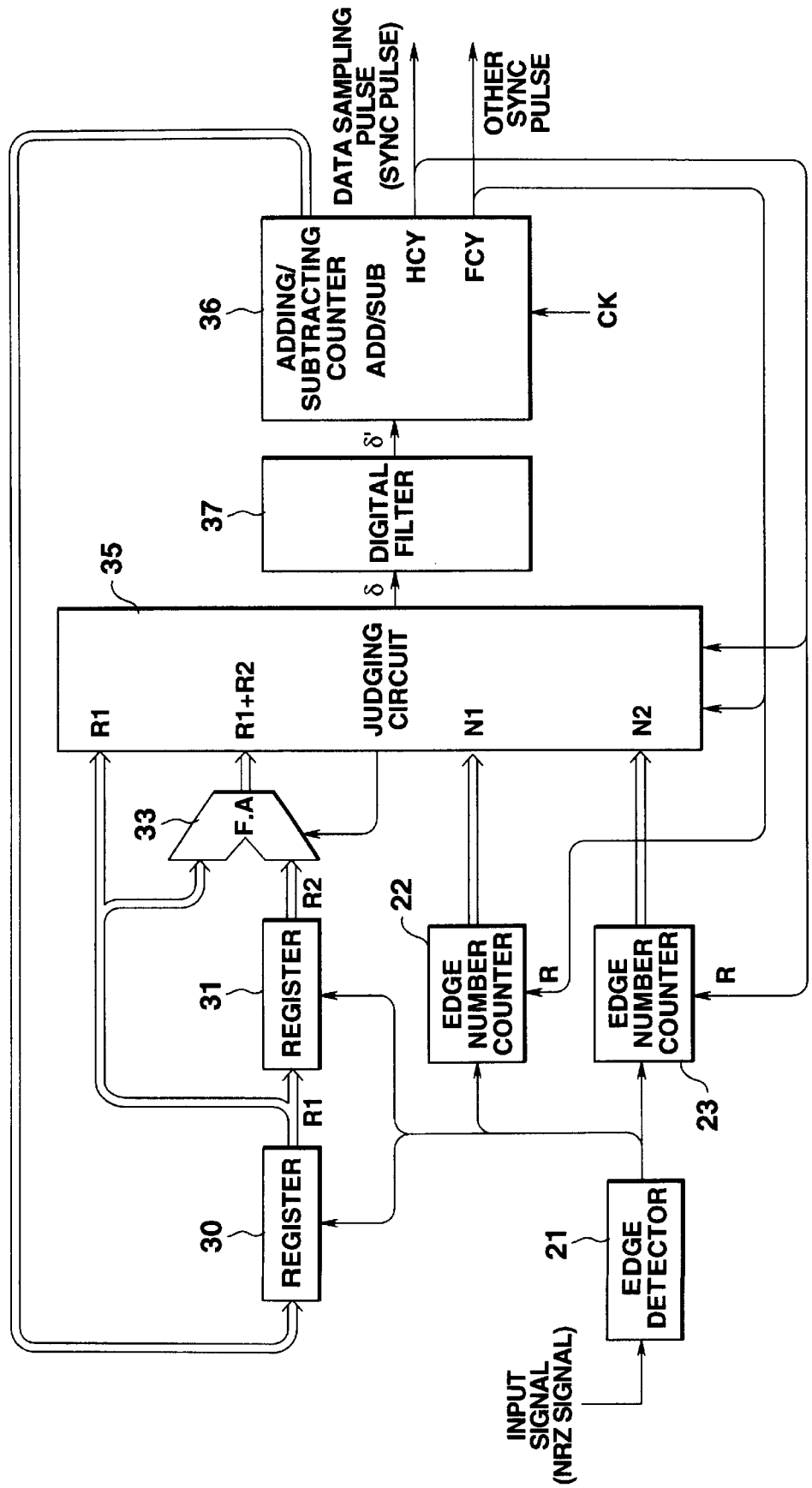
FIG. 6 schematically represents a circuit arrangement of a bit synchronizing circuit according to a fourth embodiment mode of the present invention.

FIG. 6 schematically represents a circuit arrangement of a bit synchronizing circuit according to a fourth embodiment mode of the present invention. It should be understood that in this fourth embodiment, a basic circuit arrangement thereof is similar to that of the third bit synchronizing circuit shown in FIG. 5, but the following different circuit is made. That is, a limitation is made of a correction value of a count value which can be corrected every 1 cycle. FIG. 6 represents a circuit arrangement of the above-described featured structure. It should be noted that the same reference numerals shown in FIG. 5 will be employed as those for indicating the same, or similar circuit elements of the fourth embodiment.

In FIG. 6, an edge detector 21, edge number counters 22,23, registers 30, 31, a full adder 33, a judging circuit 35, and an adding/subtracting counter 36 are identical to those of the third embodiment mode shown in FIG. 5. A different circuit arrangement of this fourth embodiment from that of the third embodiment is to arrange a digital filter 37 between the judging circuit 35 and the adding/subtracting counter 36. A major function of this digital filter 37 is such that both a limiting process and a scaling process are carried out with respect to an adding/subtracting amount signal "δ" outputted from the judging circuit 35 to produce another adding/subtracting amount signal "δ'" which will then be supplied to the adding/subtracting counter 36.

Figure 7:
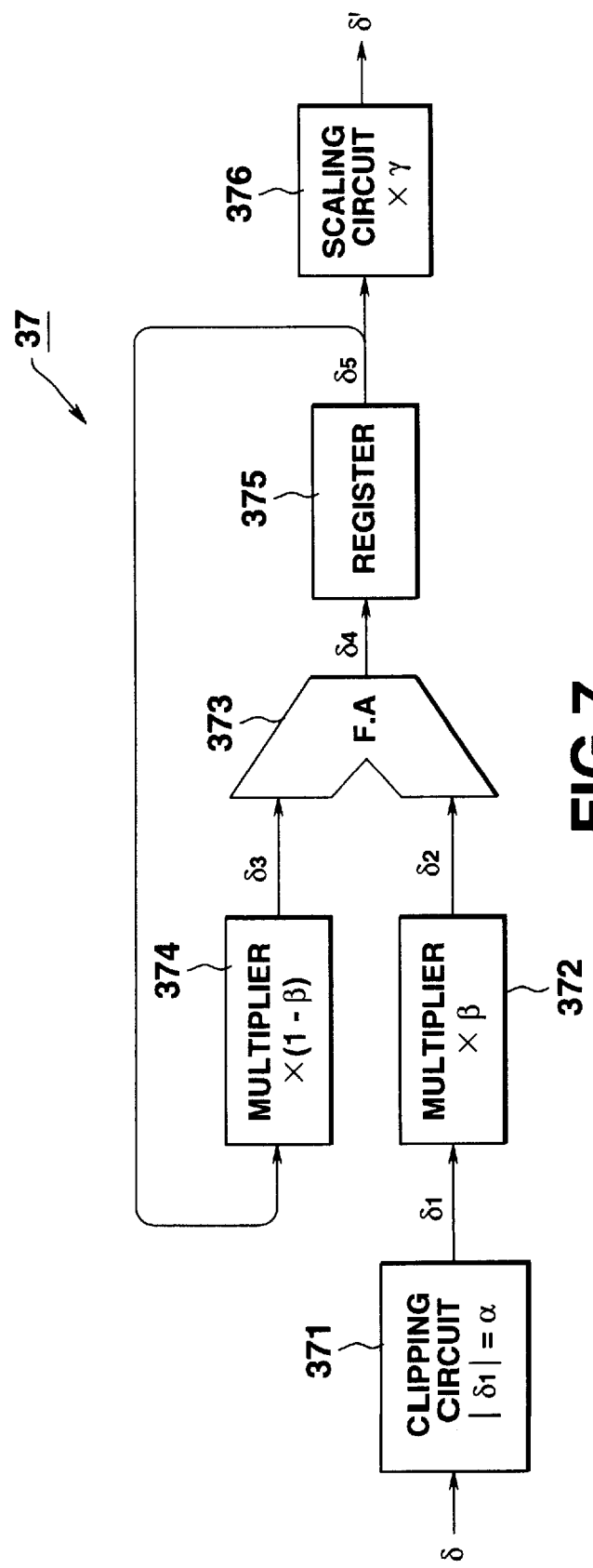
FIG. 7 is a schematic block diagram for indicating a concrete circuit arrangement of the digital filter shown in FIG. 6.

FIG. 7 represents a concrete circuit arrangement of the above-described digital filter 37. As shown in FIG. 7, a limiting process circuit and a scaling process circuit are added to an input terminal and an output terminal of a first-order IIR filter (Infinite-duration Impulse-Response filter), respectively.

In this drawing, the adding/subtracting amount signal "δ" derived from the judging circuit 35 (see FIG. 6) is entered into a clipping circuit 371. Thus clipping circuit 371 clips the adding/subtracting amount signal "δ" in such a manner that an absolute value of this adding/subtracting amount signal "δ" is present within a preselected limiting value "α", namely the limiting process operation. As a result, a clipped adding/subtracting amount signal "δ1" is multiplied by a multiplier "β" in a multiplying device 372. Then, the multiplication result is supplied as an adding/subtracting signal "δ2" to a full adder (F.A) 373.

On the other hand, another adding/subtracting amount signal "δ3" is entered to this full adder 373, which corresponds to a product made by another multiplying device 374 with a multiplier (1−β). Thus, the full adder 373 adds the adding/subtracting amount signal "δ2" to this adding/subtracting amount signal "δ3" to produce a further adding/subtracting amount signal "δ4" which will then be supplied to a register 375.

Thus, an adding/subtracting amount signal "δ5(=δ4)" corresponding to the saved value of the register 375 is supplied to the multiplier 374 and the scaling circuit 376. The scaling circuit 37 executes a scaling process operation (multiplication) by scaling the adding/subtracting amount signal "δ5" derived from the register 375 by using a scaling coefficient "γ", and then outputs the scaling-processed signal as the adding/subtracting amount signal "δ'" to the adding/subtracting counter 36.

Figure 8:
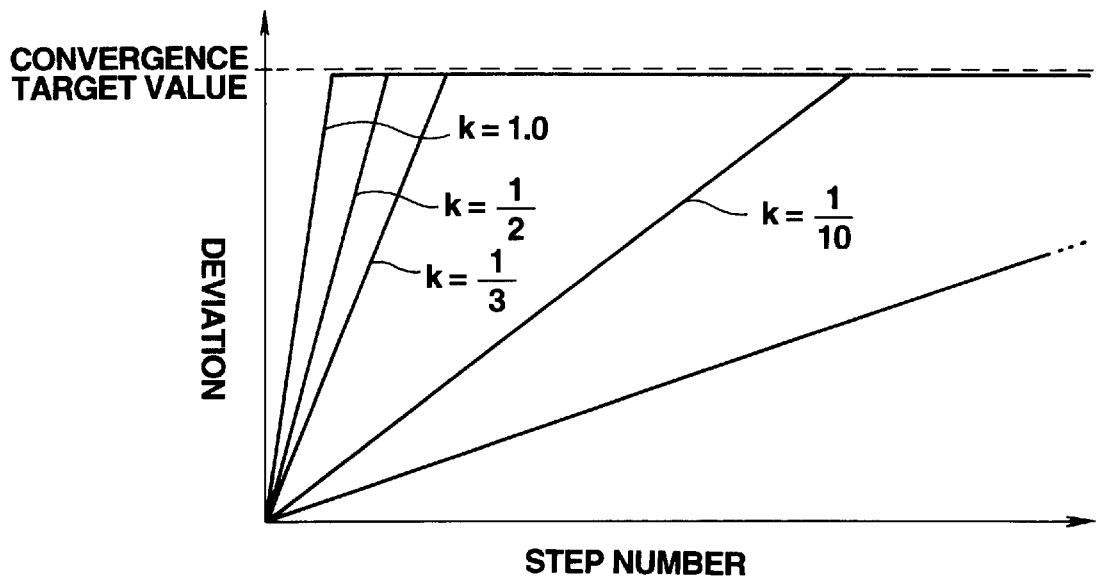
FIG. 8 graphically shows a convergence characteristic of the clipping circuit of FIG. 7 in response to a limiter coefficient.

In the above-described digital filter circuit 37, when a value "α" clipped by the clipping circuit 371 is defined by:

$$\alpha = k \times \delta max \text{ (note that "}k\text{" is limiter coefficient, and "}\delta max\text{" is maximum value of "}\delta\text{")} \quad (1),$$

a convergence characteristic of a system in correspondence with the limiter coefficient "k" is indicated in FIG. 8. As seen from this convergence characteristic, the smaller the value of this limiter coefficient "k" becomes, the quicker the movement becomes.

An adding/subtracting amount value "δ1(≦α)" obtained by the above-explained clipping process by the clipping circuit 371 is entered into the IIR filter having such a loop constructed of the multiplying device 372, the full adder 373, the multiplying device 374, and the register 375.

The characteristic of this IIR filter is given as follows: That is, a maximum value "δ5max" of an output "δ5" of the system, corresponding to the maximum saved value of the register 375, is given by:

$$\delta 5max = \delta 5max \times (1-\beta) + \delta 1 \times \beta \quad (2)$$

A response (a halfed step number) Z(half) of the system is given by:

$$Z(half) = -1/(\log_2(1-\beta)) \quad (3)$$

In a practical case, the multiplies "β" in the multiplying devices 372 and 374 may be determined, while considering only to the response characteristic of the system.

Figure 9:
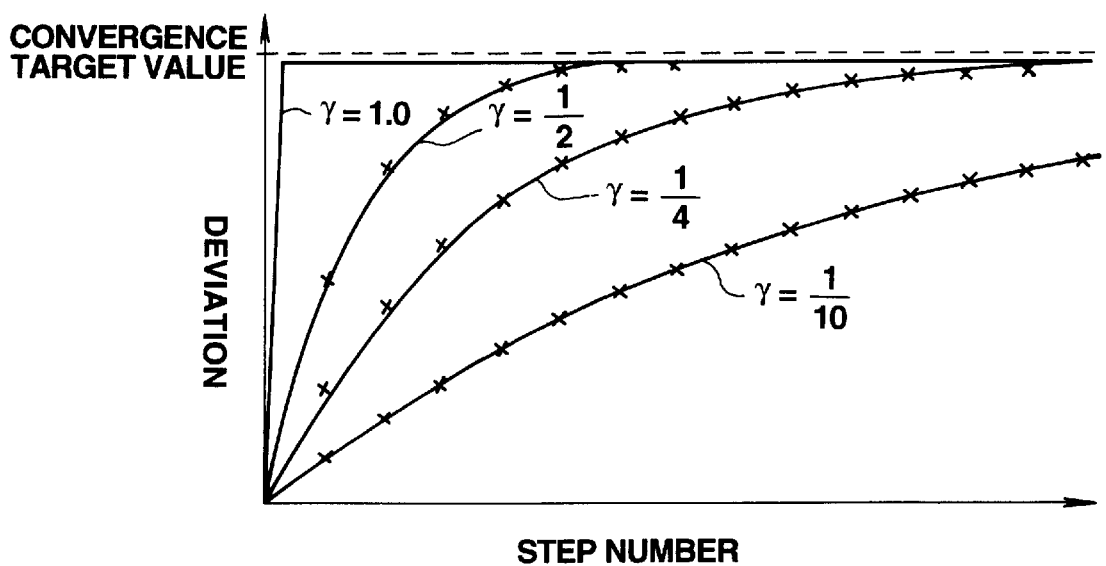
FIG. 9 graphically shows a convergence characteristic of the scaling circuit of FIG. 7 in response to a scaling coefficient.

The scaling circuit 376 performs the scaling process operation with respect to the resultant adding/subtracting amount signal "δ5". At this time, a convergence characteristic of the system in correspondence with the employed scaling coefficient "γ(0<γ≦1)" is represented in FIG. 9. That is, the smaller the value of the scaling coefficient "γ" becomes, the smoother this value is converged. The adding/subtracting amount signal "δ'" which has been processed by the scaling process operation is supplied as an output of the digital filter 37 to the adding/subtracting counter 36 shown in FIG. 6.

When such a digital filter 37 is inserted into the loop of the bit synchronizing circuit, concretely speaking, this digital filter 37 is interposed between the judging circuit 35 and the adding/subtracting counter 36 to close this loop, the digital filter 37 is operated as the second-order filter while the adding/subtracting amount signal "δ" is outputted from the judging circuit 35. The characteristic of this loop may be determined based upon the IIR filter characteristic determined by the above-described multiplier "β" of the digital filter 37, the clipping value "α(limiter coefficient k)", and the scaling coefficient "γ". That is, the above-defined formulae (2) and (3) are made effective to the characteristics shown in FIG. 8 and FIG. 9. Accordingly, both the clipping value "α" and the scaling coefficient "γ" may be defined in accordance with the specification required in this fourth bit synchronizing circuit.

Figure 10:
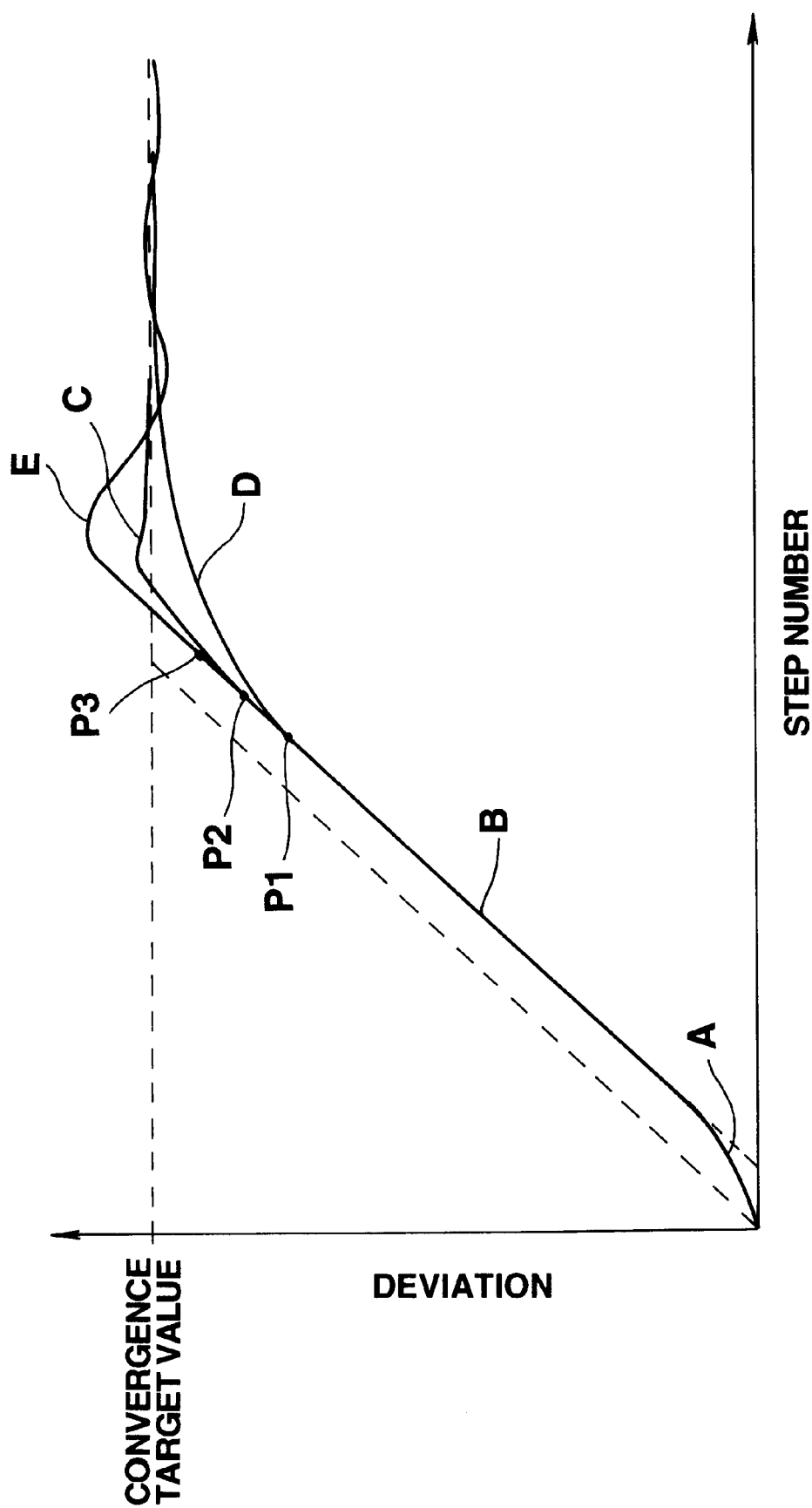
FIG. 10 graphically represents a response characteristic of the overall system of the digital filter shown in FIG. 7.

FIG. 10 graphically represents a response characteristic of an overall system of this digital filter 37. As apparent from a curve "A" of this filter characteristic, since the filter characteristic is gently raised in the beginning stage, the adverse influence caused by the single noise and the like can be eliminated. Therefore, as represented by a line "B", the convergence value is changed in a constant speed. A change amount of this convergence value is set based on the clipping value "α" and the scaling coefficient "Y". When the value of αxγ is increased, the change amount is increased, whereas when the value of αxγ is decreased, the change amount is decreased. Then, when the value of the adding/subtracting amount signal "δ" derived from the judging circuit 35 is smaller than, or equal to the clipping value "α" of the clipping circuit 371, the convergence value is converged to a target convergence value in connection with variations corresponding to the value of the adding/subtracting amount signal "δ" and the dimension of the scaling coefficient "γ". In other words, when the convergence value up to the target convergence value becomes such a value corresponding to the clipping value "α" in FIG. 10, the convergence value is converged to this target convergence value.

Also, another curve "C" of FIG. 10 indicates a convergence curve defined in the case that both the clipping value "α" and the scaling coefficient "γ" are set to optimum values. If the convergence value up to the target convergence value has passed a point "P1" whose value corresponds to the clipping value "α", then the convergence value is converged to the target convergence value in connection with variations in the value of the adding/subtracting amount signal "δ" and the dimension of the scaling coefficient "γ". Furthermore, a curve "D" shows a convergence curve in such a case that although the value of αxγ is identical to that of the above-described convergence curve "C", the clipping value "α" is increased. In this case, since the clipping value "α"is larger than that of the convergence curve C, the convergence curve is converged to the target convergence value from another point "P2" earlier than the above-described point "P1". However, since the scaling coefficient "γ" is small, the converging speed is delayed, as compared with that of the convergence curve C. Also, another curve "E" indicates a convergence curve in such a case that although the value of αxγ is identical to that of the above-described convergence curve "C", the scaling value "γ" is increased. In this case, since the clipping value "α" is smaller than that of the convergence curve C, the convergence curve is converged to the target convergence value from another point "P3" later than the above-described point "P1". However, since the scaling coefficient "γ" is large, the convergence curve is overshooted.

In accordance with the bit synchronizing circuit of this fourth embodiment mode, since the maximum correction amount of the adding/subtracting counter 36 by which the correction value can be corrected within one time is limited to a predetermined amount (namely, amount produced by multiplying clipping value "α" by scaling coefficient "γ"), the correction of the improper count value caused by the single noise can be greatly reduced. In other words, as to the bit synchronizing circuit of the third embodiment, in the case that after the bit synchronization is established, such a signal superimposed with the single pulse is entered, so that the count value of either the edge number counter 22 or the edge number counter 23 becomes 2, if the position of this single noise on the input signal is largely shifted from the normal bit end position, then the count value of the adding/subtracting counter 36 is considerably corrected. To the contrary, in the bit synchronizing circuit of the fourth embodiment, the correction amount of the count value of the adding/subtracting counter 36 in such a case can be suppressed to a predetermined amount, namely αxγ value.

It should also be noted that the above-described digital filter 37 of the fourth embodiment mode is employed so as to restrict the maximum correction amount of the adding/subtracting counter 36 by which the count value can be corrected within one time, and therefore the structure of this digital filter 37 is not limited to the filter structure shown in FIG. 7. For instance, in the filter structure of FIG. 7, the multiplier of the multiplying device 372 is selected to be "β", and the multiplier of the multiplying device 374 is selected to be (1-β). Alternatively, the multiplier of the multiplying device 374 may be selected in such a way that a summation of this multiplier and the multiplier of another multiplying device 372 is not equal to 1. That is, for example, the multiplier of the multiplying device 374 may be set to (0.9-β), the multiplier of the multiplying device 372 may be set to (β/2), and the multiplier of the multiplying device 374 may be set to (1-β)/2. Furthermore, the coefficients "β" and "γ" may be alternatively changed in response to the time lapse after starting the signal receiving operation, or after predetermined time has passed. It should also be understood that as explained with reference to the fourth embodiment and the third embodiment shown in FIG. 5, such a method for outputting the adding/subtracting amount in accordance with the bit synchronization amount from the judging circuit 35 or 38 may be similarly applied to the following case. That is, a circuit arrangement used to acquire the data required by the judging circuit is equal to the above-explained circuit arrangement shown in FIG. 3.

CIRCUIT ARRANGEMENTS OF FIFTH/SIXTH BIT SYNCHRONIZING CIRCUITS

Figure 11:
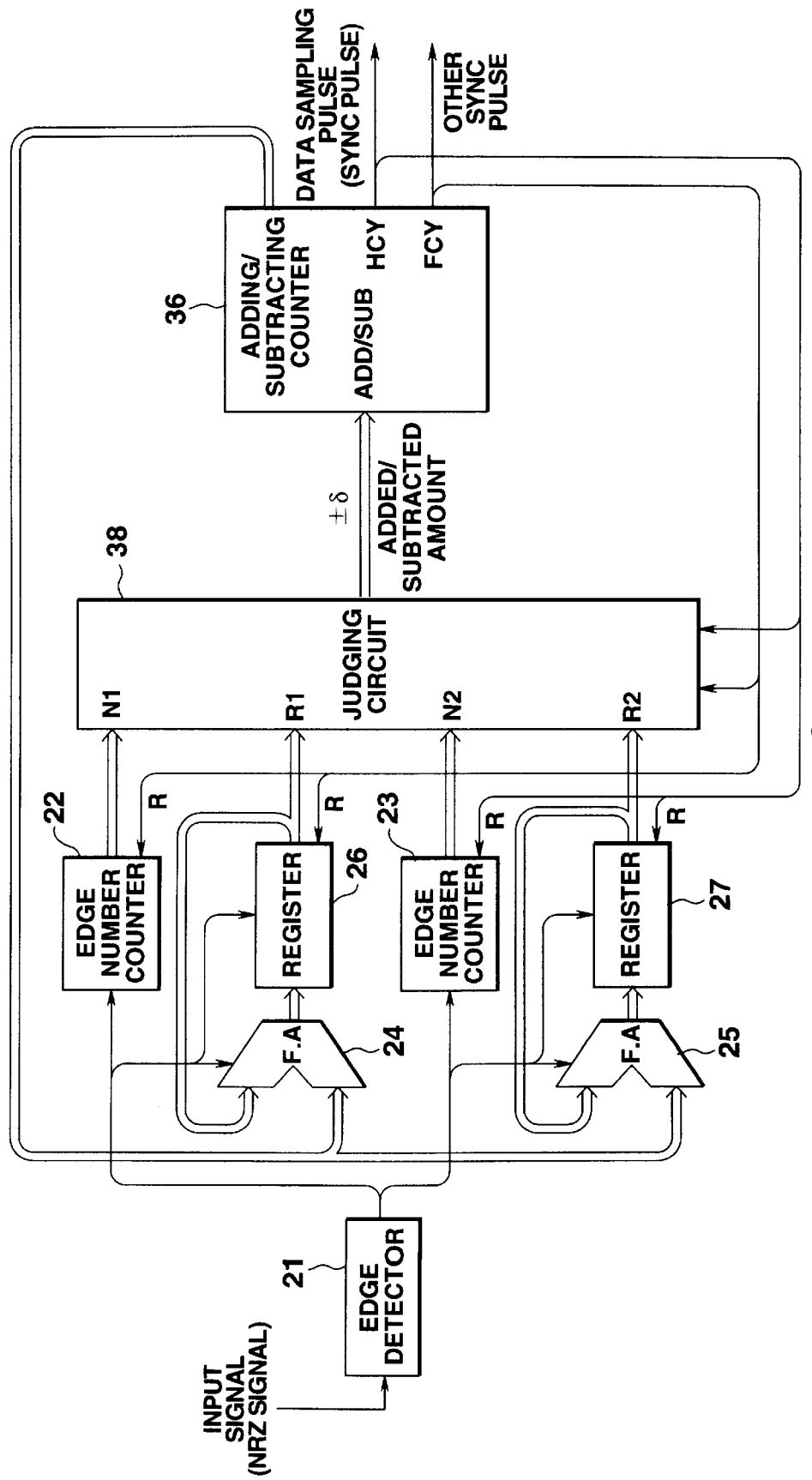
FIG. 11 is a schematic block diagram for indicating a bit synchronizing circuit according to a fifth embodiment mode of the present invention.

FIG. 11 schematically shows a bit synchronizing circuit according to a fifth embodiment of the present invention, featured by replacing, in principle, the circuit unit constructed of the judging circuit 28 and the up/down counter 29 shown in FIG. 3 by the circuit unit arranged by the judging circuit 35 and the adding/subtracting counter 36 shown in FIG. 5. Similarly, FIG. 12 schematically shows a bit synchronizing circuit according to a sixth embodiment of the present invention, featured by replacing, in principle, the circuit unit constructed of the judging circuit 28 and the up/down counter 29 shown in FIG. 3 by the circuit unit arranged by the judging circuit 35, the digital filter 37, and the adding/subtracting counter 36 shown in FIG. 5.

Figure 12:
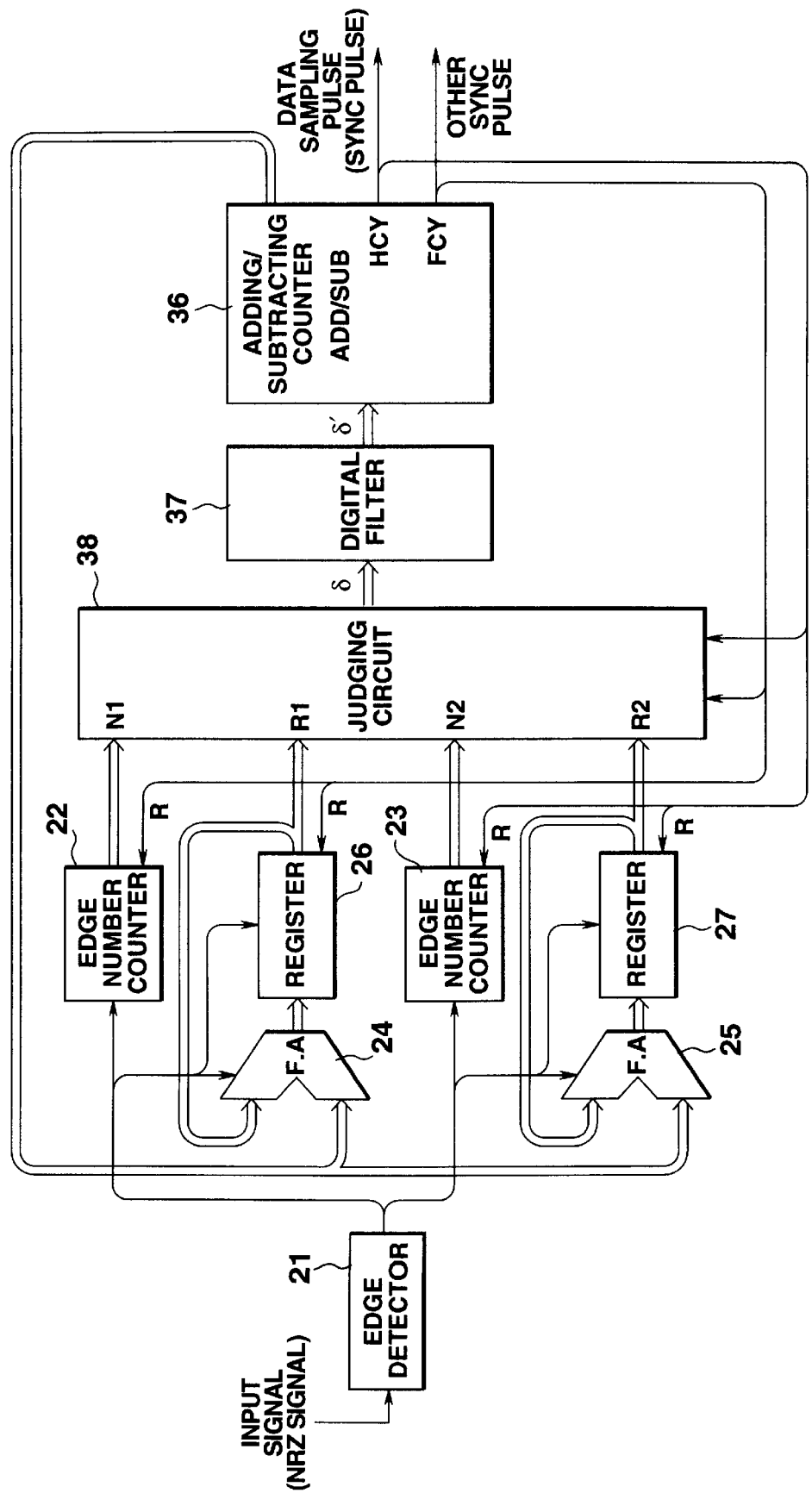
FIG. 12 is a schematic block diagram for indicating a bit synchronizing circuit according to a sixth embodiment mode of the present invention.

In FIG. 11 and FIG. 12, since all of the circuit arrangements other than the judging circuit 38 are the same as those shown in FIG. 3, FIG. 5, or FIG. 6, the same reference numerals will be employed as those for denoting the same, or similar circuit elements. When the full carry signal FCY is entered from the adding/subtracting counter 36, the judging circuit 38 reads out the count value N1 of the edge number counter 22 and the saved value R1 of the register 26. Also, when the half carry signal HCY is inputted from the adding/subtracting counter 36, the judging circuit 38 reads out the count value N2 of the edge number counter 23 and the saved value R2 of the register 27. The read contents of this judging circuit 38 are essentially identical to those read by the judging circuit 35 shown in FIG. 5 and FIG. 6. Then, this judging circuit 38 executes a similar judging process operation to that of the judging circuit 35 shown in FIG. 5 and FIG. 6, so that a similar adding/subtracting amount signal to that derived from the judging circuit 35 is outputted. As previously explained, since all of the circuit arrangements except for the judging circuit 38 are identical to those indicated in FIG. 3, FIG. 5, or FIG. 6, a similar process operation is carried out.

As previously explained, all of the above-described first to sixth embodiments have described the NRZ (Non Return to Zero) signal has been inputted. Alternatively, an RZ (Return to Zero) signal may be entered. In this case, the data sampling clock may be outputted when either the up/down counter or the adding/subtracting counter counts a ¼ of the full count value, or a ¾ of the full count value.

Furthermore, since the present inventive idea is directed to the bit synchronizing circuits, even when a multi-value signal is entered as the input signal, if an input signal used for the bit synchronization is a binary signal, then such a multi-value signal may be employed. That is, the bit synchronizing circuits according to the present invention may be applied to the FLEX type paging signal proposed by Motorola INC., and the ERMES (European Radio Message System) type paging signal. In these different paging systems, although the 4-value modulation signal is used in the data portion, the binary signal is employed in the bit synchronization signal portion.

In addition, the bit synchronizing circuits according to the present invention may be applied not only to the bit synchronizing circuit portion of the paging receiver, but also such a circuit that a bit synchronization is established with respect to an input signal to thereby produce a bit synchronization pulse.

Also, the present invention is not limited to the above-described embodiments, but may be modified, changed, or substituted without departing from the technical spirit and scope of the invention.

What is claimed is:

1. A bit synchronizing circuit comprising:
    an N-numbering counter which executes a counting operation in response to a clock having a clock speed N times higher than a bit rate of input data, N being an integer;
    an edge detector which detects an edge of a binary signal corresponding to the input data and which outputs an edge detection pulse responsive thereto;
    a reading device which reads a count value of said N-numbering counter every time said edge detector outputs one said edge detection pulse;
    a first counter which counts a total number of said edge detection pulses outputted from said edge detector within a first cycle defined between a first period when the count value of said N-numbering counter becomes a first predetermined value and when the count value of said N-numbering counter again becomes said first predetermined value;
    a judging circuit which judges a count value of said first counter every time the count value of said N-numbering counter becomes said first predetermined value, and which also judges a bit synchronization shift based on the count value of said N-numbering counter read by said reading device only when the count value of said first counter becomes a preselected value; and
    wherein said judging circuit outputs a correction signal used to correct the count value of said N-numbering counter based on a judgment result, and corrects the count value of said N-numbering counter in accordance with the correction signal.

2. A bit synchronizing circuit as claimed in claim 1 wherein said reading device includes:
    a first register for saving a current count value of said N-numbering counter which is read every time said edge detector outputs one said edge detection pulse;
    a second register for saving a previous count value of said N-numbering counter which had previously been read and saved in the first register; and
    a full adder for adding the current count value saved by said first register to the previous count value saved by said second register.

3. A bit synchronizing circuit as claimed in claim 1 wherein:
    said preselected value of the first counter is equal to one of 1 and 2;
    said judging circuit judges the bit synchronization shift based on a current count value of said N-numbering counter read by said reading device when the count value of said first counter is equal to 1; and
    said judging circuit judges the bit synchronization shift based on both a current count value and a previous count value of said N-numbering counter read by said reading device when the count value of said first counter is equal to 2.

4. A bit synchronizing circuit as claimed in claim 1 wherein:
    said bit synchronizing circuit further comprises a second counter which counts a total number of said edge detection pulses outputted from said edge detector within a second cycle defined between a second period when the count value of the N-numbering counter becomes a second predetermined value and when the count value of the N-numbering counter again becomes said second predetermined value, said second predetermined value being shifted from said first predetermined value such that said second cycle is shifted from said first cycle by a half cycle; and
    said judging circuit further judges the count value of said second counter time the count value of said N-numbering counter becomes said second predetermined values and also judges the bit synchronization shift based upon both a current count value and a previous count value of said N-numbering counter read by said reading device when the count value of said second counter is equal to 2.

5. A bit synchronizing circuit as claimed in claim 1 wherein said judging circuit outputs a signal indicative of a correction amount corresponding to the bit synchronization shift as the correction signal used to correct the count value of said N-numbering counter.

6. A bit synchronizing circuit as claimed in claim 5 wherein said correcting circuit limits a maximum correction amount by which the count value can be corrected at any one time.

7. A bit synchronizing circuit as claimed in claim 5 wherein said correcting circuit includes a digital filter which performs at least one of a maximum correction amount limiting process and a scaling process with respect to the correction signal.

8. A method for synchronizing a counting operation of an N-numbering counter with a bit timing of an input signal, said N-numbering counter counting in response to a clock having a clock speed N times higher than a bit rate of the input signal, comprising:

detecting a changing point of the input signal;

reading a count value of said N-numbering counter every time one said changing point of the input signal is detected;

incrementing a count value of a changing-point-number counter capable of counting a total number of said changing points of the input signal;

reading the count value of said changing-point-number counter and also for clearing the count value of said changing-point-number counter every time the count value of said N-numbering counter reaches a predetermined value;

judging a bit shift occurring between the input signal and the counting operation of said N-numbering counter based on the read count value of said N-numbering counter when the read count value of the changing-point-number counter is a preselected value; and outputting a correction signal for correcting the count value of said N-numbering counter based upon a judgment result.

* * * * *

UNITED STATES PATENT AND TRADEMARK OFFICE
CERTIFICATE OF CORRECTION

PATENT NO. : 6,111,926
DATED : August 29, 2000
INVENTOR(S) : Takeshi Imaura et al.

It is certified that error appears in the above-identified patent and that said Letters Patent is hereby corrected as shown below:

Column 16,
Line 61, after "counter" insert -- every --,
Line 63, change "values" to -- value, --.

Signed and Sealed this

Twenty-second Day of October, 2002

Attest:

JAMES E. ROGAN
Attesting Officer    Director of the United States Patent and Trademark Office